(12) United States Patent
Ruellan et al.

(10) Patent No.: US 8,788,509 B2
(45) Date of Patent: Jul. 22, 2014

(54) METHOD AND DEVICE FOR CODING A HIERARCHIZED DOCUMENT

(75) Inventors: Hervé Ruellan, Rennes (FR); Roamin Bellessort, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 989 days.

(21) Appl. No.: 12/060,965

(22) Filed: Apr. 2, 2008

(65) Prior Publication Data

US 2008/0250055 A1    Oct. 9, 2008

(30) Foreign Application Priority Data

Apr. 3, 2007    (FR) ..................................... 07 54246

(51) Int. Cl.
*G06F 17/30* (2006.01)
*G06F 17/22* (2006.01)

(52) U.S. Cl.
CPC .......... *G06F 17/2247* (2013.01); *G06F 17/227* (2013.01)
USPC ............ 707/755; 707/737; 707/803; 707/809

(58) Field of Classification Search
CPC . G06F 17/2247; G06F 17/227; G06F 17/272; G06F 17/30914; G06F 17/2229; G06F 17/30867; G06F 17/30961; G06F 17/22; G06F 17/2241; G06F 17/2705
USPC .............. 707/1, 100, 102, 802, 803, 755, 737
See application file for complete search history.

(56) References Cited

U.S. PATENT DOCUMENTS 6,701,022 B2 * 3/2004 Hirao et al. .................... 382/253
7,197,510 B2 * 3/2007 Abe et al. ............... 707/999.006
7,287,217 B2 * 10/2007 Kuznetsov et al. ........... 715/235

(Continued)

FOREIGN PATENT DOCUMENTS

EP    1 517 449 A2    3/2005

OTHER PUBLICATIONS

Akira Kinno et al.: "Recursive Application of Structural Templates to Efficiently Compress Parsed XML", Web Engineering Lecture Notes in Computer Science; LNCS, Springer-Verlag, XP019013532, pp. 296-301, 2005.

(Continued)

*Primary Examiner* — Jay Morrison
*Assistant Examiner* — Dangelino Gortayo
(74) *Attorney, Agent, or Firm* — Fitzpatrick, Cella, Harper & Scinto

(57) ABSTRACT

The method of coding a hierarchized document comprises, for at least one element contained in the document:
 a step (200, 210, 220) of creating at least one pattern which describes at least structural information of said element and
 a step (230, 330) of selecting use, or not, of at least one of the created patterns, said selection depending on the efficiency of a coding operation of a set of instances of the created pattern, said coding operation implementing said created pattern.

Preferentially, the method comprises a step of creating at least two patterns which describe at least structural information of said element and a step of selecting a pattern from among the created patterns, on the basis of the efficiency of each coding operation of a set of instances of the created patterns, by implementing one of the created patterns.

12 Claims, 8 Drawing Sheets

(56) References Cited

U.S. PATENT DOCUMENTS

| | | | |
|---|---|---|---|
| 7,308,508 B1* | 12/2007 | Dewa | 709/247 |
| 7,530,017 B2* | 5/2009 | Kinno et al. | 715/249 |
| 7,581,170 B2* | 8/2009 | Baumgartner et al. | 715/234 |
| 7,593,949 B2* | 9/2009 | Begun et al. | 707/999.1 |
| 7,707,491 B2* | 4/2010 | Suzumura et al. | 715/234 |
| 7,856,595 B2* | 12/2010 | Itani | 715/234 |
| 7,873,663 B2* | 1/2011 | Willis et al. | 707/791 |
| 8,166,053 B2* | 4/2012 | Zhou et al. | 707/755 |
| 2005/0022115 A1* | 1/2005 | Baumgartner et al. | 715/513 |
| 2006/0101435 A1* | 5/2006 | Akilov et al. | 717/141 |
| 2006/0242563 A1* | 10/2006 | Liu et al. | 715/513 |
| 2008/0098029 A1 | 4/2008 | Ruellan | 707/102 |

OTHER PUBLICATIONS

Kalman et al.: "Compacting XML Document" Information and Software Technology, XP005204706, pp. 90-106, vol. 48, No. 2, Feb. 2006.

Zaki, M.J.: "Efficiently Mining Frequent Trees in a Forest: Algorithms and Applications", IEEE Transactions on Knowledge and Data Engineering, IEEE Service Center, XP011135628, pp. 1021-1035, vol. 17, No. 8, Aug. 2005.

Wilfred NG et al.: "Comparative Analysis of XML Compression Technologies" Word Wide Web Information and Web Information Systems, Kluwer Academic Publishers, XP019216865, pp. 5-33, vol. 9, No. 1, Mar. 2006.

* cited by examiner

| | |
|---|---|
| 100 | `<list>` |
| 110 | `  <object id="1" available="1">` |
| 111 | `    <reference>EF 50mm f/1.2L USM</reference>` |
| 112 | `    <focal length>50mm</focal length>` |
| 116 | `    <aperture>1.2</aperture>` |
| 119 | `  </object>` |
| 120 | `  <object id="2" available="1">` |
| 121 | `    <reference>EF 85mm f/1.2L II USM</reference>` |
| 122 | `    <focal length>85mm</focal length>` |
| 126 | `    <aperture>1.2</aperture>` |
| 129 | `  </object>` |
| 130 | `  <object id="3" available="1">` |
| 131 | `    <reference>EF 24-70mm f/2.8L USM</reference>` |
| 132 | `    <focal length>` |
| 133 | `      <min>24mm</min>` |
| 134 | `      <max>70mm</max>` |
| 135 | `    </focal length>` |
| 136 | `    <aperture>2.8</aperture>` |
| 139 | `  </object>` |
| 140 | `  <object id="4" available="1">` |
| 141 | `    <reference>EF 70-200mm f/4L USM</reference>` |
| 142 | `    <focal length>` |
| 143 | `      <min>70mm</min>` |
| 144 | `      <max>200mm</max>` |
| 145 | `    </focal length>` |
| 146 | `    <aperture>4</aperture>` |
| 149 | `  </object>` |
| 199 | `</list>` |

METHOD AND DEVICE FOR CODING A HIERARCHIZED DOCUMENT

CROSS REFERENCE TO RELATED APPLICATIONS

This application claims the benefits of French Patent Application No. 0754246, filed on Apr. 3, 2007, which is hereby incorporated by reference herein in its entirety.

FIELD OF THE INVENTION

The present invention concerns a method and a device for hierarchized document pattern selection.

BACKGROUND OF THE INVENTION

XML (acronym for "Extensible Markup Language") is a syntax for defining computer languages. Thus XML makes it possible to create languages that are adapted for different uses but which may be processed by the same tools. An XML document is composed of elements, each element starting with an opening tag comprising the name of the element (for example: "<tag>") and ending with a closing tag which also comprises the name of the element (for example "<tag>"). Each element can contain other elements or text data. Furthermore, an element may be specified by attributes, each attribute being defined by a name and having a value. The attributes are placed in the opening tag of the element they specify (for example '<tag attribute"value">'). XML syntax also makes it possible to define comments (for example "<!—Comment—>") and processing instructions, which may specify to a computer application what processing operations to apply to the XML document (for example "<?myprocessing?>". >>).

The set of the elements, attributes, text data, comments and processing instructions are grouped together under the generic name of "node".

Several different XML languages may contain elements of the same name. To be able to mix several different XML languages, an addition has been made to XML syntax making it possible to define "Namespaces". Two elements are identical only if they have the same name and are situated in the same namespace. A namespace is defined by a URI (acronym for "Uniform Resource Identifier"), for example "http://canon.crf.fr/xml/mylanguage". The use of a namespace in an XML document is via the definition of a prefix which is a shortcut to the URI of that namespace. This prefix is defined using a specific attribute (for example "xmins:ml="http://canon.crf.fr/xml/mylanguage" associates the prefix "ml" with the URI "http://canon.crf.fr/xml/mylanguage"). Next, the namespace of an element or of an attribute is specified by having its name preceded by the prefix associated with the namespace followed by ':' (for example '<ml:balise ml:attribut="valeur">').

XML has numerous advantages and has become a standard for storing data in a file or for exchanging data. XML makes it possible in particular to have numerous tools for processing the files generated. Furthermore, an XML document may be manually edited with a simple text editor. Moreover, as an XML document contains its structure integrated with the data, such a document is very readable even without knowing the specification.

The main drawback of the XML syntax is to be very prolix. Thus the size of an XML document may be several times greater than the inherent size of the data. This large size of XML documents thus leads to a long processing time when XML documents are generated and especially when they are read.

To mitigate these drawbacks, other methods for coding an XML document have been sought. The object of these methods is to code the content of the XML document in a more efficient form, but enabling the XML document to be easily reconstructed. However, most of these methods do not maintain all the advantages of the XML format. Among these methods, the simplest consists of coding the structural data in a binary format instead of using a text format. Furthermore, the redundancy of the structural information in the XML format may be eliminated or at least reduced (for example, it is not necessarily useful to specify the name of the element in the opening tag and the closing tag).

Another method is to use an index table, in particular for the names of elements and attributes which are generally repeated in an XML document. Thus, at the first occurrence of an element name, it is coded normally in the file and an index is associated with it. Next, for the following occurrences of this element name, the index is used instead of the complete string, reducing the size of the document generated, but also facilitating the reading (there is no longer need to read the complete string in the file, and furthermore, the determination of the read element may be carried out by a comparison of integers instead of a comparison of strings of characters).

A second set of methods relies on the use of patterns detected in the XML document to code. These patterns represent pieces of structural information and certain pieces of content information of the XML document. The object of these methods is to code the repeated patterns in the XML document to avoid coding the same information several times.

These coding methods are efficient for XML documents containing numerous repetitions of structures that are identical or very similar. However, these methods of pattern creation are not optimal for the coding of an XML document, in terms of the size of the coded document.

SUMMARY OF THE INVENTION

The present invention aims to mitigate these drawbacks. In particular, the present invention is directed to enabling the creation of patterns that are optimized for the coding of an XML document.

To that end, according to a first aspect, the present invention concerns a method of coding a hierarchized document comprising, for at least one element contained in the document:

a step of creating at least one pattern which describes at least structural information of said element and a step of selecting use, or not, of at least one created pattern, said selection depending on the efficiency of a coding operation of a set of instances of the created pattern, said coding operation implementing said created pattern.

By virtue of these provisions, a pattern Is used for the coding only if its use increases the efficiency of the coding, that is to say reduces the coding cost.

According to particular features, the coding method of the present invention, as succinctly set forth above comprises, for at least one element contained in the document:

a step of creating at least two patterns which describe at least structural information of said element and a step of selecting at least one of the created patterns, said selection depending on the efficiency of a plurality of coding operations of a set of instances of the created patterns, a coding operation implementing at least one of the created patterns.

By virtue of these provisions, the coding efficiency is optimized by the selection of a pattern from among several patterns describing the same element.

According to particular features, the step of creating at least two patterns comprises:

a step of creating an initial pattern which describes at least structural information of said element and a step of creating at least one specialized pattern by modifying an already created pattern referred to as "to specialize".

It is to be noted that this specialization may apply either to an initial pattern, or to a pattern that is itself specialized.

According to particular features, during the step of creating the initial pattern, a pattern is created that is designated "empty" which comprises no description of content information of said element and, for the empty pattern, a set of the values corresponding to instances associated with said empty pattern and, during the step of creating a specialized pattern, at least one pattern to specialize and a set of associated values are implemented.

The term "content" covers the values of attributes, text values and the sub-pattern definitions contained in the pattern.

According to particular features, during the step of creating at least one specialized pattern, there is created, from the pattern to specialize, at least one specialized pattern comprising content information common to several instances of the pattern to specialize.

According to particular features, the step of creating at least one specialized pattern comprises a step of separating the instances of the pattern to specialize into two sets, one remaining associated with the pattern to specialize, the other being associated with the specialized pattern.

According to particular features, during the step of creating at least one specialized pattern a specialized pattern is created by incorporating into the pattern to specialize each of the pairs of at least one of the following sets of pairs:

(attribute, attribute value) possessed by all the instances associated with the pattern to specialize, (text content, text content value) possessed by all the instances associated with the pattern to specialize and (sub-pattern, sub-pattern definition) possessed by all the instances associated with the pattern to specialize.

According to particular features, during the step of creating at least one specialized pattern a specialized pattern is created by incorporating into the pattern to specialize at least one of the pairs:

(attribute, attribute value) that is the most frequent for the instances associated with the pattern to specialize, (text content, text content value) that is the most frequent for the instances associated with the pattern to specialize and (sub-pattern, sub-pattern definition) that is the most frequent for the instances associated with the pattern to specialize.

It is to be noted that this method does not calculate all the possibilities for the creation of a specialized pattern and thus avoids an excessively costly exhaustive calculation.

According to particular features, the step of creating at least one specialized pattern comprises a step of separating the instances of the pattern to specialize into two sets, one remaining associated with the pattern to specialize, the other being associated with the specialized pattern, the instances comprising said pair being associated with the specialized pattern, the instances not comprising said pair being associated with the pattern to specialize.

According to particular features, further to the step of separating the instances, a supplementary step of creating specialized patterns is applied to the patterns and instances resulting from the separating step, when the number of instances associated with a pattern is greater than a predetermined value.

This reduces the number of calculations to perform and makes it possible to avoid creating patterns for a small number of instances.

According to particular features, when all the specialized patterns have been created, the selecting step further comprises a step of determining, for each created pattern, the saving in coding in case of implementation of that created pattern, relative to the coding without implementing said pattern and a step of eliminating created patterns for which said saving is negative.

This makes it possible to verify, globally, that each of the created patterns is efficient, in terms of coding cost, for the coding of the document.

According to particular features, the steps of creating and selecting are carried out successively, for at least one element of the document, of at least one pattern associated with at least one of the sub-elements of said element and of a pattern associated with said element.

By virtue of these provisions, optimization of all the patterns of a document, for example XML, or of a part of that document, is achieved recursively and little by little without performing a simultaneous optimization of all those patterns, an optimization which would consume a lot of calculation resources and which would therefore be very slow.

According to particular features, the method as succinctly set forth above comprises a step of creating a pattern designated "encompassing" formed by the union of at least two created patterns, this union containing all the structural and content information comprised in at least one of the patterns having undergone union.

According to a second aspect, the present invention concerns a device for coding a hierarchized document, comprising, for the processing of at least one element contained in the document:

a means for creating at least one pattern which describes at least structural information of said element and a means for selecting use, or not, of each created pattern, said selection depending on the efficiency of a coding operation of a set of instances of the created pattern, said coding operation implementing said created pattern.

According to particular features:

the creating means is adapted to create at least two patterns which describe at least structural information of said element and the selecting means selects at least one of the created patterns, depending on the efficiency of a plurality of coding operations of a set of instances of the created patterns, a coding operation implementing at least one of the created patterns.

According to a third aspect, the present invention concerns a computer program loadable into a computer system, said program containing instructions enabling the implementation of the coding method as succinctly set forth above.

According to a fourth aspect, the present invention concerns an information carrier readable by a computer or a microprocessor, removable or not, storing instructions of a computer program, characterized in that it enables the implementation of the coding method as succinctly set forth above.

As the advantages, objectives and features of this device, of this program and of this information carrier are similar to those of the coding method of the present invention, as succinctly set forth above, they are not reviewed here.

BRIEF DESCRIPTION OF DRAWINGS

Other advantages, objectives and features of the present invention will emerge from the following description given, with an explanatory purpose that is in no way limiting, with respect to the accompanying drawings, in which.

FIG. 1 is a diagram of a hierarchized document,

DETAILED DESCRIPTION OF A PREFERRED EMBODIMENT

FIG. 1 is an XML document example on which the invention may be applied. This document 100 describes a list of objects (here, camera lenses) with some of their characteristics. Due to all the objects described being similar, the descriptions have similar structures. Thus, each lens is described by its reference, its focal length and its maximum aperture. However, some differences in characteristics have an impact on the structure of the description. Thus, the "focal length" element comprises just a text value in the case of fixed lenses, whereas it is composed of two sub-elements corresponding to the extreme values for zoom.

Figure 2:
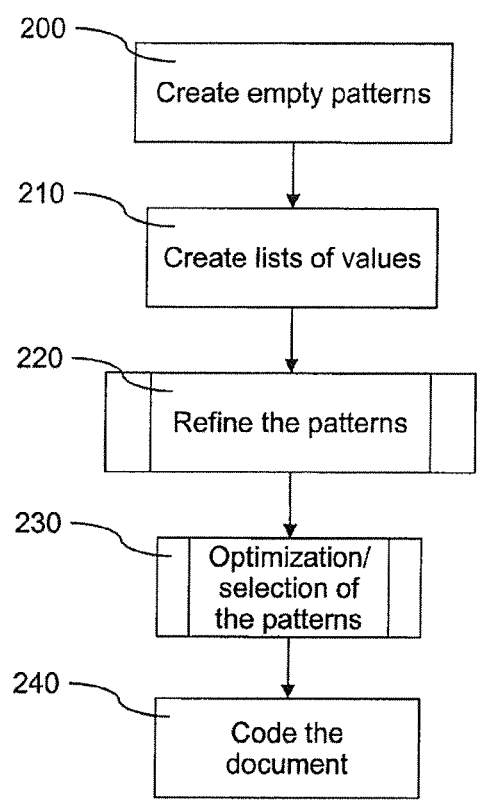
FIG. 2 is a representation, in the form of a logigram, of the steps implemented in a particular embodiment of the coding method of the present invention.

FIG. 2 shows, by a succession of steps, the general principle for creation of patterns and for coding a hierarchized document, here an XML document, according to the invention. During a first step, 200, what is designated a "first level" empty pattern is created for each element contained in the document. A first level pattern corresponds to the description of the document over a single level of depth, that is to say without describing the sub-elements included in the element described by the pattern. An empty pattern corresponds to the description of the structural information, without description of content information.

Thus, for the element of FIG. 1 commencing at line 110 and ending at line 119, the corresponding empty first level pattern is:
element "object" with attributes "id" and "available", containing:
pattern
pattern
pattern If, in the document, two elements have identical structures, they are associated with the same pattern.

Thus, the element of FIG. 1 starting at line 120 and ending at line 129 is associated with the same empty first level pattern as the element starting at line 110 and ending at line 119. The same applies for the element starting at line 130 and ending at line 139, as well as for the element starting at line 140 and ending at line 149.

During a second step, 210, for each pattern created at step 200, the set of the lists of values corresponding to each element associated with that pattern is created. For each element, the list of values corresponds to the values of the attributes, to the text values and to the references of the included patterns. When a value corresponds to a reference to an included pattern, that reference contains the identity of the included pattern, as well as the list of the values associated with it.

Thus, for the element starting at line 110 and ending at line 119, the list of the values is:
1 (attribute "id")
1 (attribute "available")
pattern "reference" with the text value "EF 50 mm f/1.2 L USM"
pattern "focal length 1" with the text value "50 mm"
pattern "aperture" with the text value "1.2"

These lists of values are grouped together for each pattern. Thus, the pattern describing the elements "aperture" of lines 116, 126, 136 and 146 has for set of lists, the values:
1.2
1.2
2.8
4

Each of these values represents the text value contained in an element associated with the pattern. It is to be noted that the values repeated for the same location are kept.

During a third step, 220, the patterns created at step 200 are used as well as the set of the lists of values determined at step 210 to refine the empty patterns. This step may be carried out, for example by implementing the logigram described relative to FIGS. 3, 4 and 5, on the root element of the XML document.

This step 220 in particular makes it possible to create patterns of any level. A first level pattern corresponds to the description of the document over a single level of depth, that is to say without describing the sub-elements included in the element described by the pattern. A pattern of second level corresponds to the description of the document over two levels of depth, that is to say by describing an element and its child elements, but without describing the sub-elements included in the child elements. And so forth. It is to be noted that a pattern may describe only a part of an element or of its sub-elements.

This step 220 also makes it possible to create patterns comprising attribute values or test values.

Next, during a fourth step, 230, all the patterns refined at step 220 are gone through to determine whether they are efficient after all the refinements and only the efficient patterns are selected. This step may be carried out, for example, by implementing the logigram described relative to FIG. 6 and, possibly, that described relative to FIG. 7. It is to be noted that step 230 is optional.

Finally, during a last step, 240, the document is coded using the patterns created and selected during the preceding steps. For this, each of the selected patterns is coded. The coding of a pattern consists of coding all the structural and content information that it contains. As a variant, a pattern may be coded by difference with respect to another pattern, by only coding the differences between the two patterns.

Furthermore, each node of the XML document is coded. A node associated with a selected pattern (or with a part of a selected pattern) is coded relative to that pattern. For this, the pieces of information present in the node and not present in the pattern are coded. Furthermore, for the pieces of information present in the pattern and not present in the node, their absence is coded.

A node not associated with a selected pattern is coded by implementing techniques known to the person skilled in the art, without the use of a pattern.

In a variant, the coding of the patterns and of the nodes is carried out textually. In another variant, the patterns and the nodes are coded using a specific XML language. In still another variant, the coding of the patterns and of the nodes is carried out in binary manner.

As a variant, at least one pattern is created, empty first level or specialized, which describes at least structural information of a given element. For each created pattern, the use, or not, of that created pattern is selected, depending on the efficiency of a coding operation of a set of instances of the created pattern, said coding operation implementing the created pattern. Thus, the present invention is not limited to the choice of one pattern from among a plurality of patterns but covers the case of the decision to use each created pattern. In the case where a single pattern is considered, that pattern may be an empty first level or specialized pattern, including the case of the encompassing pattern described later.

Figure 3:
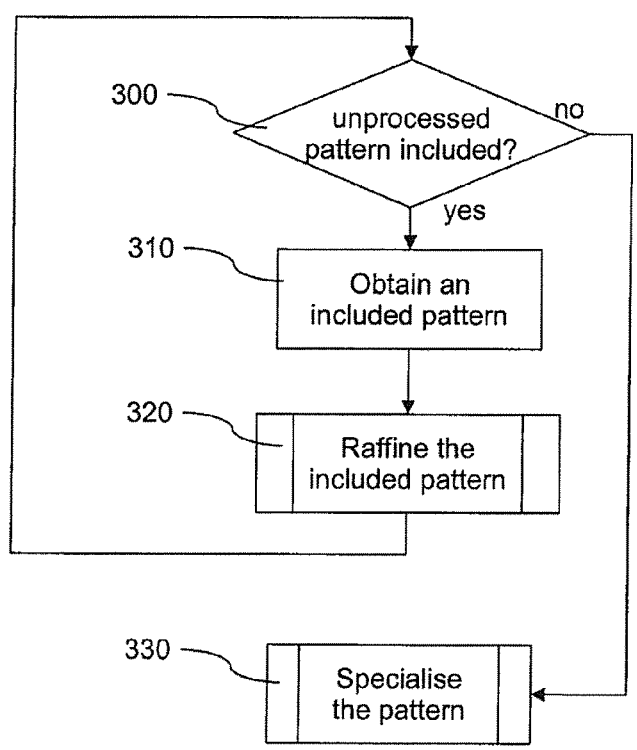
FIG. 3 is a representation in the form of a logigram of the steps implemented in one of the steps illustrated in FIG. 2.

FIG. 3 describes in logigram form an algorithm for refining a pattern. This algorithm processes a set of patterns starting with a pattern associated with an XML element and by processing all the patterns associated with one of the sub-elements, whether direct or not, of the starting XML element. This recursive processing makes it possible to optimize, little by little, the set of the patterns of an XML document or of a part of that XML document, without necessitating a simultaneous optimization of all those patterns.

To carry out the refinement of the set of the patterns of an XML document, this algorithm is executed at first on the empty first level pattern corresponding to the root element of the XML document.

The logigram of FIG. 3 applies to a pattern, denoted "m" associated with an element denoted "e". During a step 300, it is determined whether the element e contains at least one child element denoted "ei", associated with a pattern denoted "mi" not yet having been refined by the steps illustrated in FIG. 3.

If this is the case, during a step 310, that pattern mi is obtained that is included in the pattern m, associated with that element ei, child of the element e.

Next, the succession of steps described FIG. 3 is carried out recursively on the pattern mi and the element ei, during a step 320. After this step 320, the pattern mi has been refined and step 300 is returned to. Starting from step 300, if all the patterns mi included in the pattern m have been processed, step 330 is proceeded to during which the pattern m is specialized. This step 330 is described with reference to FIG. 4, which gives a description in logigram form of the steps that enable a pattern to be specialized. The object of this specialization is to create, on the basis of that pattern, one or more patterns of any level that are able to include text content information. These specialized patterns are then used during the coding of the XML document.

The steps divide into two groups. The first group, steps 400 to 460, modify the initial pattern to include therein content information or definitions of sub-patterns common to all the instances of the initial patter. The second part, steps 470 and 480, separates the instances into two sets, one remaining associated with that initial pattern, the other being associated with a new pattern, specialized on the basis of that initial pattern. It is noted that this logigram may apply either to an empty first level created pattern, or to a pattern created by this algorithm, or "specialized", which created patterns are termed, in both cases, "pattern to specialize".

During a step 400, it is determined whether there exists, among the contents of the pattern m, at least one constant content that has not been processed. The term "content" covers the values of attributes, text values and the sub-pattern definitions contained in the pattern. A content is considered as constant for a pattern if its value is identical for all the instances associated with that pattern. If the result of step 400 is positive, that is to say if there remains at least one unprocessed content, that constant content is obtained during a step 410.

For example, for the pattern representing the element "object" in the XML document of FIG. 1, the four instances of that pattern comprise the value "1" for the attribute "available". Thus, for this pattern, the value of the attribute "available" is constant for all the instances associated with that pattern. In the same way, for that same pattern, the first sub-element corresponds, for the four instances, to the same sub-pattern definition, i.e. an element "reference" containing a text value. Thus, for this pattern, the definition of the first sub-pattern is constant. On the other hand, for that same pattern, the second sub-element varies according to the instances. For the first two instances, this second sub-element corresponds to the definition of a sub-pattern composed of an element "focal length" containing a text value. For the last two instances, this second sub-element corresponds to the definition of a sub-pattern composed of an element "focal length" containing two sub-elements.

Next, during a step 420, it is determined whether the inclusion of this constant content in the pattern m is efficient, that is to say favorable in terms of coding cost, the cost of a coding operation representing the quantity of information necessary for the coding of all the instances associated with the patter. For this, the coding cost is compared using the initial pattern with that using the initial pattern modified by the inclusion of the constant content. The coding cost using the initial pattern includes the coding cost of the initial pattern added to the coding cost of each of its instances according to that initial pattern. The coding cost using the initial pattern modified by the inclusion of the constant content comprises the coding cost of the modified pattern added to the coding cost of each of the instances of the initial pattern according to that modified pattern.

If the inclusion is not efficient, that is to say if the coding cost using the modified pattern is greater than the coding cost using the initial pattern, step 400 is returned to. If the inclusion is efficient, during a step 430, the constant content obtained during step 410 is included in the initial pattern. The initial pattern is thus replaced by the modified pattern. Next, step 400 is returned to.

If, during step 400, it is determined that there is no more unprocessed constant content, that is to say obtained during step 410 and tested, in terms of efficiency during step 420, step 440 is proceeded to.

In the case of the pattern representing the "object" element in the XML document of FIG. 1, when step 440 is proceeded to, this pattern has become:

element "object" with an attribute "id" and an attribute "available" having the value "1", this element comprising:

element "reference" containing a text value pattern element "aperture" containing a text value.

During the step 440, obtainment of a better content for the creation of a specialized pattern is attempted, as described with reference to FIG. 5. Next, during a step 450, it is determined whether a better content has been found. If not, the succession of steps terminates at a step 490.

If a better content has been found, a step 460 is proceeded to, during which a specialized pattern is created from the initial pattern. This specialized pattern is created as a copy of the initial pattern to which is added the best content obtained during the step 440.

Returning to the example of the pattern representing the element "object" in the XML document of FIG. 1, a specialized pattern may be created for example by adding to that pattern the definition of a sub-pattern for the second sub-element present in the element "object", this definition corresponding to an element "focal length" containing two sub-elements.

Still by way of example, for the pattern representing the element "aperture" in the XML document of FIG. 1, a specialized pattern may be created for example by adding the value "1.2" to that pattern as text content value.

Next, the set of the instances is divided between the two patterns, i.e. the pattern obtained before step 440, initial or modified, and the specialized pattern. The instances comprising the best content are associated with the specialized pattern. The instances not including it remain associated with the initial or modified pattern.

Next, the initial pattern is again specialized during a step 470. Next, the specialized pattern is specialized in turn, during a step 480 and the processing terminates at step 490.

Figure 4:
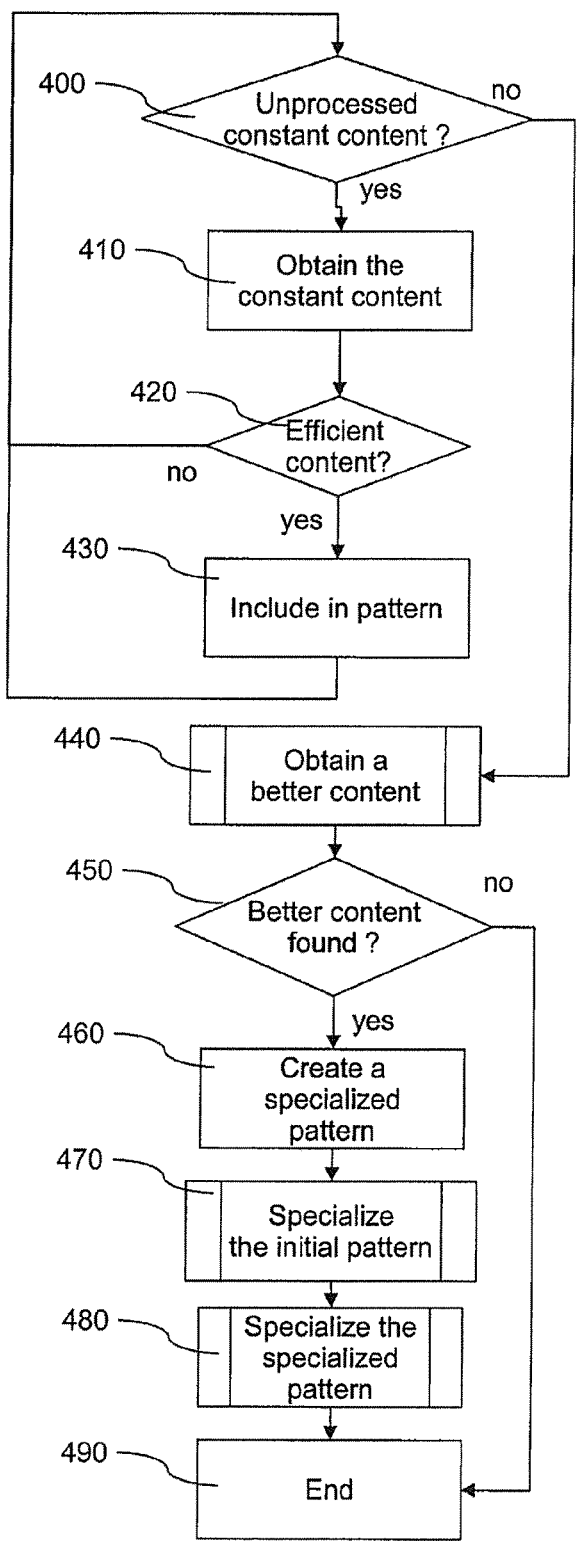
FIG. 4 is a representation in the form of a logigram of the steps implemented in one of the steps illustrated in FIG. 3.

Returning to the example of the element "object in the XML document of FIG. 1, and assuming that the best content yielded by step 440 is the sub-pattern definition corresponding to the element "focal length" containing two sub-elements, at the end of the steps illustrated in FIG. 4, there are two patterns describing the element "object". The first pattern is:

element "object" with an attribute "id" and an attribute "available" having the value "1", this element comprising:
element "reference" containing a text value
element "focal length" containing a text value
element "aperture" containing the text value "1.2"
The second pattern is:
element "object" with an attribute "id" and an attribute "available" having the value "1", this element comprising:
element "reference" containing a text value
element "focal length" containing:
element "min" containing a text value
element "max" containing a text value
element "aperture" containing a text value In a variant embodiment, a pattern is only specialized if the number of instances associated with it is greater than a predetermined minimum number. This reduces the number of calculations to perform and makes it possible to avoid creating patterns for a small number of instances.

In another variant embodiment, step 420 is deleted and all constant content is added to the initial pattern. This is because, for a content corresponding to an attribute value or to a text value, the inclusion of the content is always efficient. In the case of a content corresponding to a sub-pattern, this is not always the case, but it is difficult to exactly determine the efficiency of the inclusion of such a content, since a sub-pattern definition may be used within several other patterns and the exact coding cost thus depends on the choices made for all the patterns containing that sub-pattern definition. This variant thus makes it possible to reduce the number of calculations carried out without however greatly adversely affecting the optimization of the patterns generated.

In a variant embodiment, a coding cost in relation to a set of patterns M is evaluated by coding the entirety of the XML document using a binary coding. To evaluate this coding cost, the patterns of the set M and all the other patterns already created and selected are used during the coding. During this coding, each node of the XML document is coded using the pattern with which it is associated.

In another variant embodiment, a coding cost relative to a set of patterns M is evaluated by only coding the nodes of the XML document corresponding to the instances of a pattern of the set M and using a binary coding.

In still another variant embodiment, a coding cost relative to a set of patterns M is evaluated by calculating the number of bytes necessary for the coding of the entirety of the XML document using a binary coding implementing the patterns of the set M and all the other patterns already created and selected. This calculation is performed by considering all the pieces of data to code and by calculating the number of bytes necessary for coding each of those pieces of data according to the binary coding rules used. In such a variant embodiment, the calculation may be carried out iteratively, only the portion of the coding cost corresponding to the evaluated set of patterns M being re-calculated.

In still another variant embodiment, a coding cost relative to a set of patterns M is evaluated by calculating the number of bytes necessary for the coding of the nodes of the XML document corresponding to the instances of a pattern of the set M and using a binary coding implementing the patterns of the set M and all the other patterns already created and selected. This calculation is performed by considering all the pieces of data to code and by calculating the number of bytes necessary for coding each of those pieces of data according to the binary coding rules used.

In another variant embodiment, the calculation of the number of bytes necessary for the coding of a set of nodes of the XML document is carried out according to the binary coding rules used and pieces of empirical data. These pieces of empirical data make it possible to evaluate the size of coding of certain pieces of data without having to code the entirety of the XML document (or a large part thereof). These pieces of empirical data are obtained from the coding of a large number of XML documents. One example of empirical data is the average size of an index. These pieces of empirical data may depend on the characteristics of the XML document. For example, the average size of an index may depend on the size of the XML document.

Figure 5:
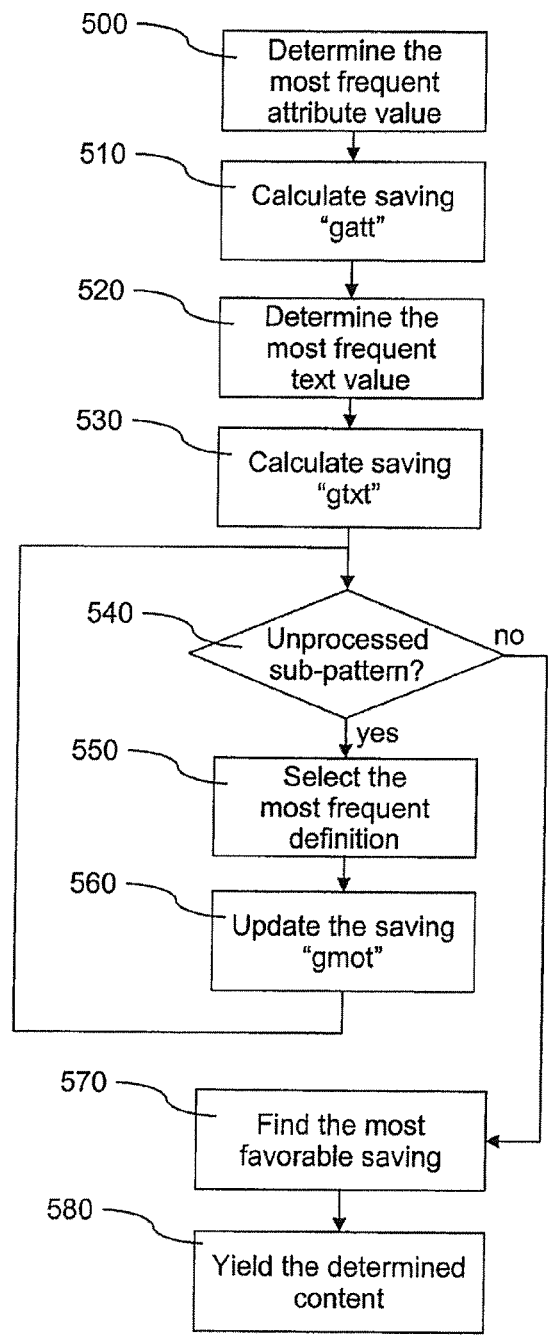
FIG. 5 is a representation in the form of a logigram of the steps implemented in one of the steps illustrated in FIG. 4, FIGS. 6 and 7 are a representation in logigram form of the steps implemented in steps illustrated in FIG. 2

FIG. 5 describes, in the form of a logigram, steps for finding the best content of a pattern m, of which the value is not included in that pattern m, for the creation of a specialized pattern comprising the value of that content.

During a step 500, the pair (attribute, attribute value) is selected that is the most frequent for the pattern m. For this, each attribute of which the value is not contained in the pattern is considered in turn. For each attribute, each of the values it takes in the instances associated with the pattern m is considered, the number of occurrences of each of the values of that attribute is counted and the most frequent value for that attribute is selected. Thus, the most frequent value for each attribute is obtained. Next, the frequency of the value selected for each attribute is compared in order to retain only the attribute for which that obtained value is the most frequent for all the attributes. This attribute and the value obtained constitute the determined attribute and the determined value.

During a step 510, calculation is made of the potential saving obtained by including the determined value for the determined attribute in a specialized pattern. For this, two coding costs are compared. The first coding cost comprises the cost coding of the pattern m added to the coding cost of the set of the instances associated with the pattern m. The second coding cost comprises the coding cost of the pattern m, the coding cost of the specialized pattern including the determined value for the determined attribute, added to the coding cost of the set of the instances associated with the pattern m. The coding cost of an instance associated with the pattern m is the coding cost of the instance relative to the specialized pattern if the value of the determined attribute for the instance is the determined value, or otherwise the coding cost of the instance relative to the pattern m.

The potential saving is the difference between the first coding cost and the second coding cost. A negative saving means that the use of the specialized pattern is unfavorable. The potential saving is stored in a variable "gatt".

It is to be noted that if the pattern m does not comprise any attribute of which the value is not in the pattern, the potential saving takes the value −1.

Next, the pair (text content, text content value) is selected that is the most frequent for the pattern m, during a step 520, thus determining a text content and an associated value, and then the potential saving associated with that pair is calculated during a step 530, and that potential saving is stored in a variable "gtxt". These two steps are carried out in similar manner to the steps 500 and 510.

The following steps make it possible to determine the best sub-pattern and the best associated definition for inclusion in the pattern m.

First of all, during a step 540, it is determined whether there remains a sub-pattern not included in the definition of the pattern m and not yet processed. If this is not the case, step 570 is proceeded to. If the result of step 540 is positive, that sub-pattern is selected, as well as the most frequent definition from among the instances of the pattern m, during a step 550. For this, within the pattern m, a content corresponding to a non-included sub-pattern is selected. Next, for each instance associated with the pattern m, the sub-pattern definition associated with that content is selected. By counting the number of occurrences of each sub-pattern definition for that content, the most frequent definition for that sub-pattern is obtained, and a pair (sub-pattern, sub-pattern definition) is created.

For example, for the earlier pattern definition by the description:
element "object" with an attribute "id" and an attribute "available" having the value "1", this element comprising:
element "reference" containing a text value
pattern
element "aperture" containing a text value
A non-included sub-pattern is the sub-pattern corresponding to the second sub-element of the element "object".

Next, the potential saving is evaluated that corresponds to the inclusion of the selected definition for the selected sub-pattern in a specialized pattern, during a step 560. The evaluation of this potential saving is similar to that achieved for the attribute values and the text values. The potential saving for this sub-pattern definition is compared to the best potential saving found for a sub-pattern definition evaluated previously. This better potential saving is stored in a variable "gmot", this variable being initialized, at the beginning, to the value −1. If the potential saving associated with the selected sub-pattern and with the selected definition is greater than the value of the variable "gmot", that variable takes that potential saving as its value, and the selected sub-pattern as well as the selected definition become the determined sub-pattern and definition.

It is to be noted that if there is no unprocessed sub-pattern within the pattern m, the value of the variable "gmot" is −1 (its initial value) and there is no determined sub-pattern.

After step 560, step 540 is returned to.

When all the sub-patterns have been processed, determination is made during step 570 of the best content on the basis of the determined attribute value, of the determined text value and of the definition of the determined sub-pattern. For this, the values of three variables "gatt", "gtxt" and "gmot" are compared.

If these three values are negative, there is no favorable context for the creation of a specialized pattern. In this case, the determined content is null. Otherwise, the algorithm determines the greatest of these three values and the determined content is the content associated with the greatest of these three values. The algorithm yields the determined content at step 580.

Next, step 450 is proceeded to.

It is to be noted that the algorithm described with regard to FIG. 5 does not calculate all the possibilities for creating a specialized pattern. This is because such an exhaustive calculation is often too costly and does not necessarily improve the solution found.

It is to be noted, furthermore, that the determination of the attribute value and the determination of the text value are different from the determination of the sub-pattern definition, for structural reasons. More particularly, there is an high correlation between the frequency of an attribute value or a text value frequency and the associated potential saving, whereas this is not the case for a sub-pattern definition. The choice made in the embodiment illustrated in FIG. 5 represents a good compromise between the calculation time and the improvement of the result obtained.

A first variant consists, for each attribute and each text content, of calculating the potential saving for the most frequent value for that attribute or text content. In this variant, each attribute associated with its most frequent value is considered as determined attribute and determined value for performing the calculation of potential saving described at step 510. Similarly, each text content associated with its most frequent value is considered as determined text content and determined value. This variant makes it possible to make a calculation of potential saving for the attributes and the text contents similar to that achieved for the sub-patterns. This first variant makes it possible to evaluate a higher number of possibilities for the creation of specialized patterns, at the cost of an increase in processing operations to perform. A variation of this first variant consists of calculating the potential saving for the sub-patterns in the same way as for the attributes and the text contents, that is to say by only evaluating the potential saving for the most frequent pair (sub-pattern, sub-pattern definition). This makes it possible to accelerate the determination of the most favorable content to the detriment of the quality of that determination.

Another variant of the embodiment illustrated in FIG. 5 consists of modifying the calculation of the potential saving. In this variant, on calculating the potential saving for an determined attribute with a determined value, the specialized pattern evaluated is created differently from what is described above. The specialized pattern comprises the determined value for the determined attribute and also comprises all the attribute values and all the text values remaining constant for all the instances for which the determined attribute possesses the determined value. The calculation of the potential saving for the text contents and the sub-patterns is modified in similar manner. This variant enables a more precise evaluation of the potential saving at the cost of a slight increase in the processing operations to perform.

In another variant, the preceding variant is modified by evaluating several specialized patterns for each calculation of potential saving. On calculating the potential saving for a determined attribute with a determined value, a first created specialized pattern is evaluated as in the preceding variant. This first specialized pattern serves as a base for creating other specialized patterns. For each sub-pattern of which the definition remains constant for all the instances for which the determined attribute possesses the determined value, a specialized pattern is created on the basis of the base pattern, the specialized pattern comprising that definition. If the coding cost corresponding to this new specialized pattern is less than the coding cost for the specialized pattern serving as a base, the specialized pattern serving as a base is replaced by this new specialized pattern. When all the sub-patterns of which the definition remains constant have been processed, the potential saving is evaluated on the basis of the final specialized pattern serving as a base. The calculation of the potential saving for the text contents and the sub-patterns is carried out in similar manner. This variant enables a more precise evaluation of the potential saving at the cost of an increase in the processing operations to perform.

In the last two variants set forth above, a set of contents is evaluated, whereas the algorithm illustrated with regard to FIG. 5 only supplies a single content. The other contents of the set are retrieved on specialization of the specialized pattern, during steps 400 to 430, but this leads to a duplication of certain processing operations. Consequently, in the case of these variants, it is advantageous for the algorithm illustrated with regard to FIG. 5 to supply a list of contents. Furthermore, in the case of the specialization of a specialized pattern, steps 400 to 430 of FIG. 4 are not carried out.

In an embodiment of FIG. 5, at step 500, if several attribute values have the highest frequency as their frequency, the determined attribute value is selected at random from among those attribute values.

In a first variant, the determined attribute value is the greatest attribute value, in terms of the number of characters composing it, from among those attribute values. In a sub-variant, the comparison of the size of the attribute values is not made on the basis of the number of characters composing them, but on the number of bytes necessary to code them.

In another variant, the potential saving is calculated for each of those most frequent attribute values.

An embodiment and similar variants may be applied to steps 520 and 550.

Figure 6:
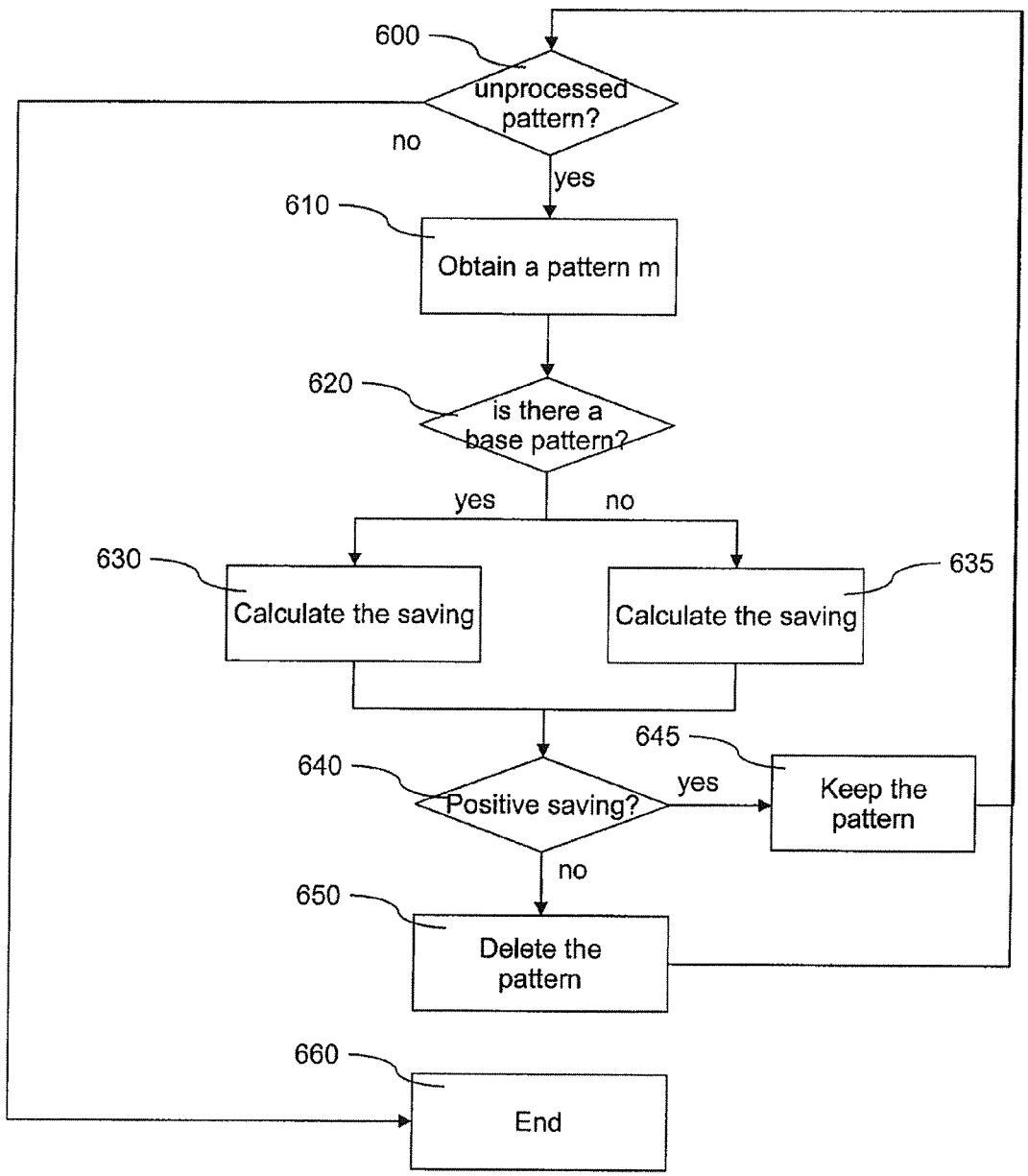

FIG. 6 describes steps making it possible to determine whether all the patterns created at the time of refinement remain efficient in the coding of the document. These steps making it possible to select those among the created patterns which remain efficient in the coding of the document. During a step 600, it is determined whether there remains at least one pattern that has not been processed by the steps illustrated in FIG. 6. If that is not the case, the processing terminates at a step 660. If an unprocessed pattern remains, an unprocessed pattern m is obtained during a step 610.

Next, during a step 620, it is determined whether that pattern m possesses a base pattern, that is to say whether it has been created by specialization relative to another pattern. If this is the case, the saving obtained when using that pattern m is calculated during a step 630. A first coding cost corresponds to the coding of the base pattern and to the coding of all the instances associated with the base pattern and with the pattern m on the basis of the base pattern. A second coding cost corresponds to the coding of the base pattern, to the coding of the pattern m, to the coding of all the instances associated with the base pattern on the basis of that base pattern and to the coding of all the instances associated with the pattern m on the basis of that pattern m. The saving is the difference between the first coding cost and this second coding cost.

If the result of step 620 is negative, that is to say if the pattern m does not have any base pattern, then the pattern m is a base pattern and the saving obtained using that pattern m is calculated during a step 635. A first coding cost corresponds to the coding of all the instances associated with the pattern m directly without using any pattern and to the coding of all the specialized patterns of the pattern m directly. A second coding cost corresponds to the coding of the pattern m, to the coding of all the instances associated with the pattern m on the basis of the pattern m and to the coding of all the specialized patterns of the pattern m on the basis of the pattern m. The saving is the difference between the first coding cost and the second coding cost.

Further to each of steps 630 and 635, during a step 640, it is evaluated whether the saving is positive. If that is the case, the pattern m is kept, during a step 645, and step 600 is returned to.

If the saving is not positive, the pattern m is deleted, during a step 650, and the instances which are associated with it are then associated with the base pattern, if the latter exists. If the base pattern does not exist, the instances which are associated with it are no longer associated with any pattern. Next, step 600 is returned to.

It is to be noted that, for correct operation of the steps illustrated in FIG. 6, it is preferable for the set of the patterns to be gone through starting with the specialized patterns and ending with the base patterns. If a pattern is specialized on the basis of a specialized pattern, the processing starts with the most specialized pattern, then continues with the one a bit less specialized, until the base pattern is arrived at.

In a variant embodiment, the steps illustrated in FIG. 6 are executed several times during the process of refining the patterns. This makes it possible to eliminate, progressively, the patterns which are no longer efficient for the coding of the document.

Figure 7:
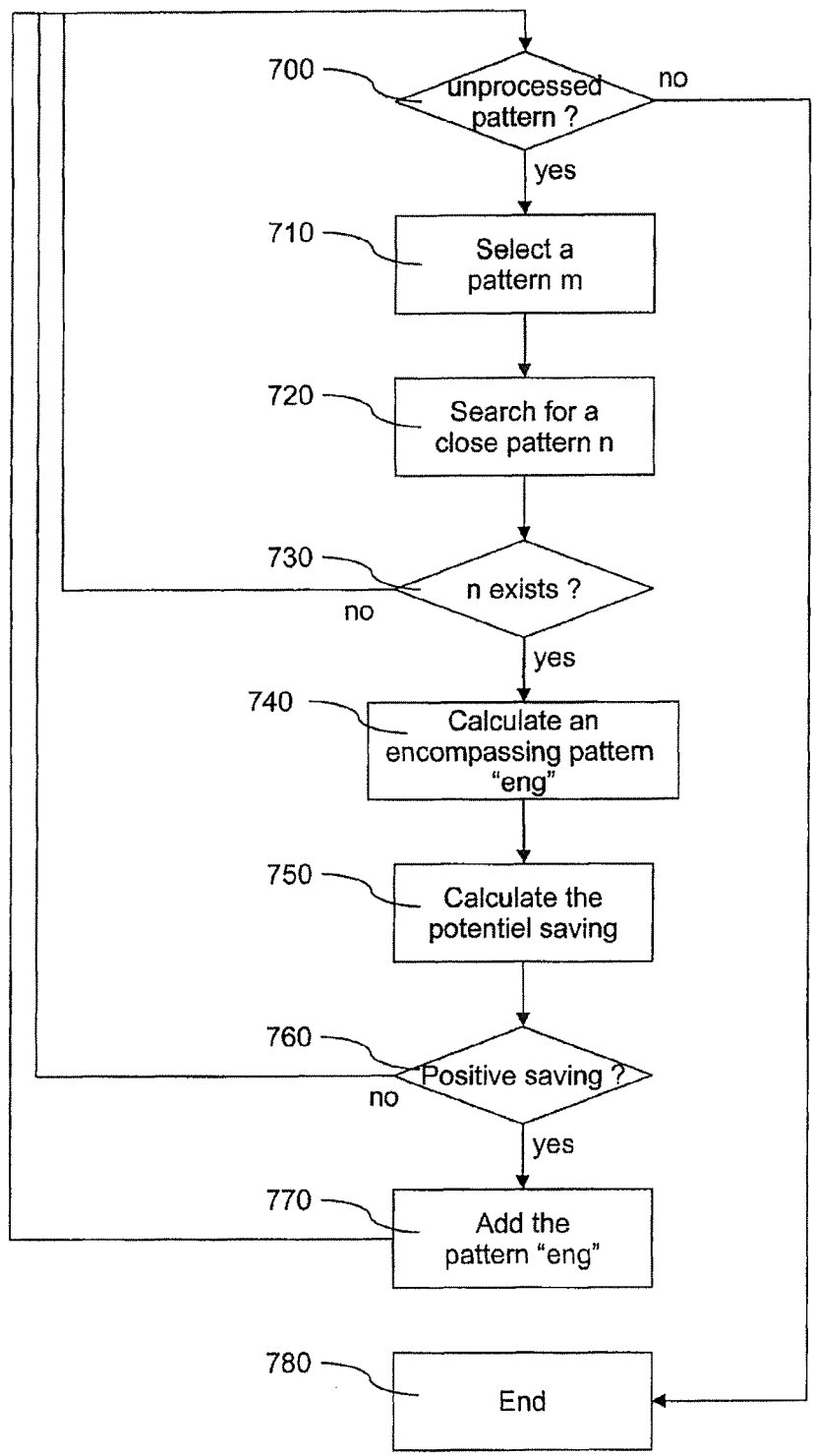

FIG. 7 describes another method of optimizing patterns. This algorithm may be executed before the algorithm of FIG. 6. It consists of using "encompassing" patterns in the coding of a file. An encompassing pattern is the union of two other patterns, which are preferably close, this union containing all the structural and content information included in at least one of the two patterns.

During a step 700, it is determined whether there is at least one pattern that has not been processed by the steps illustrated in FIG. 7. If that is not the case, the processing terminates at a step 780.

If it is the case, an unprocessed pattern m is selected during a step 710. Next, during a step 720, a pattern n "close" to m is searched for. A pattern is considered "close" to another pattern as a decreasing function of the number of pieces of structural and content information differing between the two patterns. The smaller the number of differences between the two patterns, the "closer" the patterns are considered to be. A predetermined closeness criterion is used to decide whether some particular pattern is close to the pattern m.

During a step 730, it is determined whether a pattern n close to the pattern m has been found. Otherwise, step 700 is returned to. If a pattern n close to the pattern m has been found, an encompassing pattern "eng" is constructed, during a step 740. Next, during a step 750, the potential saving associated with that encompassing pattern eng is calculated. A first coding cost corresponds to the coding cost of the pattern m, to the coding cost of the pattern n, to the coding cost of all the instances associated with the pattern m on the basis of that pattern m and to the coding cost of all the instances associated with the pattern n on the basis of that pattern n. A second coding cost corresponds to the coding cost of the pattern eng, to the coding cost of the pattern m on the basis of the pattern eng, to the coding cost of the pattern n on the basis of the pattern eng, to the coding cost of all the instances associated with the pattern m on the basis of that pattern m and to the coding cost of all the instances associated with the pattern n on the basis of that pattern n. The saving is the difference between the first coding cost and the second coding cost.

During a step 760, it is determined whether the saving is positive. Otherwise, step 700 is returned to. If the saving is positive, a step 770 is proceeded to, during which the pattern eng is added to the set of the patterns used for the coding of the document. The pattern eng has no associated instance, but makes it possible to reduce the coding cost of the patterns m and n. Next, step 700 is returned to.

A variant embodiment consists of searching, for a pattern m, for all the close patterns. Next, for each of those close patterns, the potential saving associated with the encompassing pattern constructed on the basis of the pattern m and that close pattern is evaluated. The encompassing pattern of which the potential saving is the greatest is kept for the coding. This variant embodiment may be applied several times to the same pattern m, so long as a new encompassing pattern having a potential saving can be found. More generally, it is possible to add other patterns in similar manner to the set of the patterns used for the coding of the document. A new pattern will only be added if the potential saving associated with it is positive.

Figure 8:
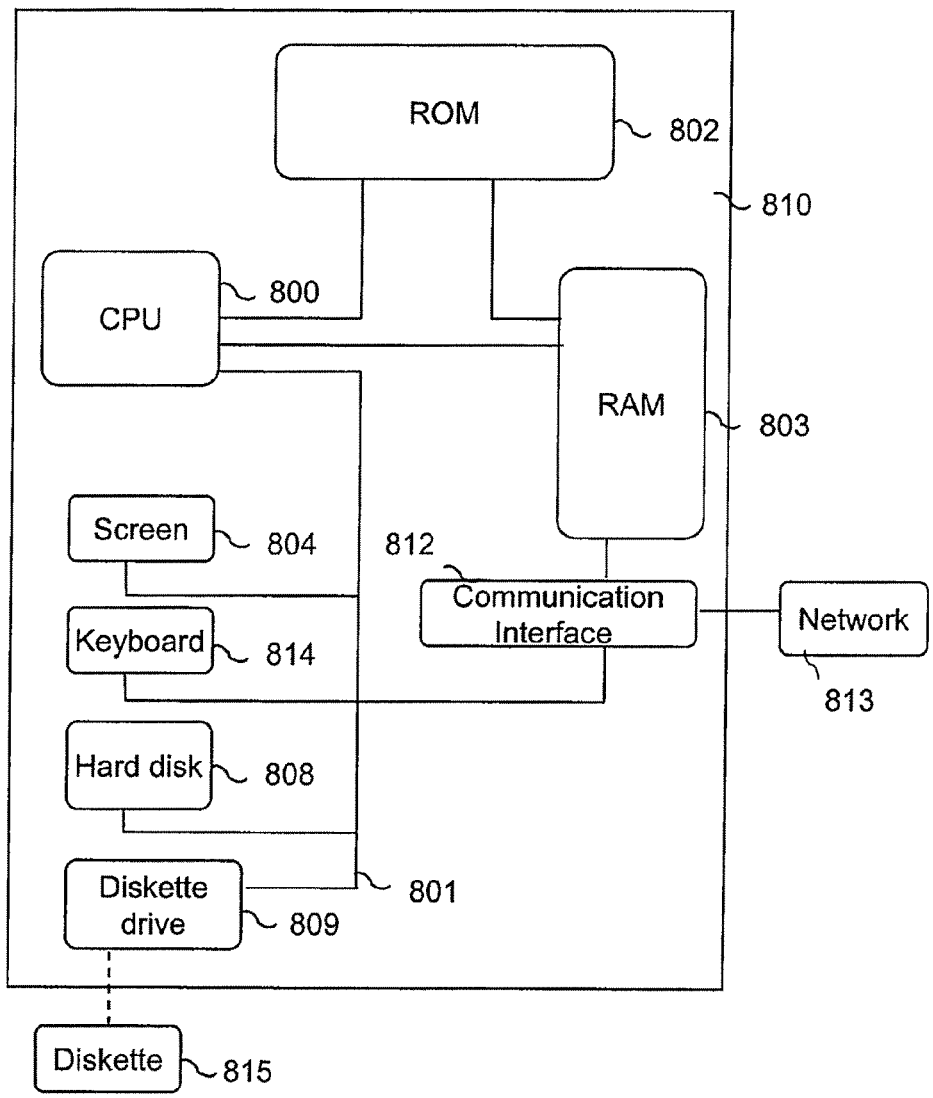
FIG. 8 is a diagram of a particular embodiment of the coding device of the present invention.

As represented in FIG. 8, a device 810 implementing the invention is for example a micro-computer connected to different peripherals supplying information to process by the implementation of the present invention.

The device 810 comprises a communication interface 812 connected to a network 813 able to transmit digital data to be processed or conversely to transmit data processed by the device. The device 810 also comprises a storage means 808 such as a hard disk. It also comprises a drive 809 for a disk 815. This disk 815 may for example be a diskette, a CD-ROM, or a DVD-ROM. The disk 815 like the hard disk 808 can contain data processed according to the invention as well as the program or programs implementing the invention which, once read by the device 810, will be stored on the hard disk 808. According to a variant, the program enabling the device to implement the invention can be stored in read only memory 802 (referred to as ROM in the drawing). In a second variant, the program can be received in order to be stored in an identical manner to that described previously via the communication network 813.

This device 810 has a screen 804 for displaying the data to be processed or serving as an interface with the user, who can thus parameterize certain processing modes, using the keyboard 814 or any other means (a mouse for example).

The central processing unit 800 (referred to as CPU in the drawing) executes the instructions relating to the implementation of the invention, which are stored in the read only memory 802 or in the other storage means. For example, the central processing unit carries out the steps illustrated in FIGS. 2 to 7. On powering up, the processing programs stored in a non-volatile memory, for example the ROM 802, are transferred into the random access memory RAM 803, which will then contain the executable code of the invention, as well as registers for storing the variables necessary for implementing the invention.

More generally, an information storage means, which can be read by a computer or microprocessor, integrated or not into the device, and which may possibly be removable, stores a program implementing the method of respectively coding, transmission and decoding.

The communication bus 801 affords communication between the different elements included in the microcomputer 810 or connected to it. The representation of the bus 801 is not limiting and, in particular, the central processing unit 800 is able to communicate instructions to any element of the microcomputer 810 directly or via another element of the microcomputer 810.

The invention claimed is:

1. A method of, using at least one processor, coding a hierarchized document comprising at least one element, the method comprising the steps of:
   creating at least one initial pattern which describes at least structural information of the at least one element, and associating a set of instances of the at least one initial pattern in the hierarchized document with the at least one initial pattern,
   creating at least one specialized pattern as a modified copy of the at least one initial pattern, wherein the at least one specialized pattern comprises additional content information common to several instances of the set of instances associated with the at least one initial pattern;
   dividing the set of instances associated with the at least one initial pattern into a set of instances associated with the at least one initial pattern and a set of instances associated with each at least one specialized pattern;
   wherein, for each initial or specialized pattern, the method further comprises:
   evaluating a first coding cost where the initial or specialized pattern is used for coding a set of instances associated with the initial or specialized pattern,
   evaluating a second coding cost where the initial or specialized pattern is not used for coding the set of instances associated with the initial or specialized pattern,
   comparing the evaluated first coding cost and the evaluated second coding cost,
   keeping the initial or specialized pattern in view of coding the at least one element when the first coding cost is lower than the second coding cost, and
   eliminating the initial or specialized pattern from usage in view of coding the at least one element when the first coding cost is higher than the second coding cost, and
   coding the at least one element, the kept initial or specialized pattern associated with the at least one element, and pieces of information present in the at least one element and not present in the initial or specialized pattern being also coded,
   wherein during the step of dividing, the specialized pattern is a copy of the initial pattern to which is added additional content, and
   wherein instances comprising the additional content are associated with the specialized pattern and instances not including the additional content remain associated with the initial pattern.

2. The method according to claim 1, wherein, during the step of creating the initial pattern, a pattern is created that is designated empty, which comprises no description of content information of the element and, for the empty pattern, a set of the values corresponding to instances associated with the empty pattern and, during the step of creating a specialized pattern, at least one initial pattern and a set of associated values are implemented.

3. The method according to claim 1, wherein the step of creating at least one specialized pattern comprises a step of separating the instances of the initial pattern into two sets, one remaining associated with the initial pattern, the other being associated with the specialized pattern.

4. The method according to claim 3, wherein, further to the step of separating the instances, a supplementary step of creating specialized patterns is applied to the patterns and instances resulting from the separating step, when the number of instances associated with a pattern is greater than a predetermined value.

5. The method according to claim 1, wherein, during the step of creating at least one specialized pattern, the specialized pattern is created by incorporating into the initial pattern at least one of the pairs of at least one of the following sets of pairs:
(attribute, attribute value) possessed by all the instances associated with the initial pattern,
(text content, text content value) possessed by all the instances associated with the initial pattern, and
(sub-pattern, sub-pattern definition) possessed by all the instances associated with the initial pattern.

6. The method according to claim 1, wherein, during the step of creating at least one specialized pattern a specialized pattern is created by incorporating into the initial pattern at least one of the pairs:
(attribute, attribute value) that is the most frequent for the instances associated with the initial pattern,
(text content, text content value) that is the most frequent for the instances associated with the initial pattern, and
(sub-pattern, sub-pattern definition) that is the most frequent for the instances associated with the initial pattern.

7. The method according to claim 6, wherein the step of creating at least one specialized pattern comprises a step of separating the instances of the initial pattern into two sets, one remaining associated with the initial pattern, the other being associated with the specialized pattern, the instances comprising the pair being associated with the specialized pattern, the instances not comprising the pair being associated with the initial pattern.

8. The method according to claim 1, further comprising:
a step of selecting use of at least one of the created patterns, the selection depending on the efficiency of a coding operation of a set of instances of the created pattern, the coding operation implementing the created pattern,
wherein the selecting step further includes:
a step of determining, for each created pattern, the saving in coding in case of implementation of that created pattern, relative to the coding without implementing the pattern; and
a step of eliminating created patterns for which the saving is negative.

9. The method according to claim 8, wherein the steps of creating and selecting are carried out successively, for at least one element of the document, of at least one pattern associated with at least one of the sub-elements of the element and of a pattern associated with the element.

10. The method according to claim 1, further comprising:
a step of creating a pattern designated encompassing formed by the union of at least two created patterns, this union containing all the structural and content information comprised in at least one of the patterns having undergone union.

11. A device for coding a hierarchized document comprising, for processing at least one element contained in the document:
a creating device for creating at least one initial pattern which describes at least structural information of the at least one element, and associating a set of instances of the at least one initial pattern in the hierarchized document with the at least one initial pattern, for creating at least one specialized pattern as a modified copy of the at least one initial pattern, wherein the at least one specialized pattern comprises additional content information common to several instances of the set of instances associated with the at least one initial pattern, and for dividing the set of instances associated with the at least one initial pattern into a set of instances associated with the at least one initial pattern and a set of instances associated with each at least one specialized pattern, wherein, for each initial or specialized pattern, the creating device performs steps of:
evaluating a first coding cost where the initial or specialized pattern is used for coding a set of instances associated with the initial or specialized pattern,
evaluating a second coding cost where the initial or specialized pattern is not used for coding the set of instances,
comparing the evaluated first coding cost and the evaluated second coding cost,
keeping the initial or specialized pattern in view of coding the at least one element when the first coding cost is lower than the second coding cost, and
eliminating the initial or specialized pattern from usage in view of coding the at least one element when the first coding cost is higher than the second coding cost; and
coding the at least one element, the kept initial or specialized pattern associated with the at least one element, and pieces of information present in the at least one element and not present in the initial or specialized pattern being also coded,
wherein in the dividing, the specialized pattern is a copy of the initial pattern to which is added additional content, and
wherein instances comprising the additional content are associated with the specialized pattern and instances not including the additional content remain associated with the initial pattern.

12. A non-transitory computer-readable storage medium, storing instructions of a computer program, that makes it possible to implement a method of coding a hierarchized document comprising at least one element, the method comprising the steps of:
creating at least one initial pattern which describes at least structural information of the at least one element, and associating a set of instances of the at least one initial pattern in the hierarchized document with the at least one initial pattern,
creating at least one specialized pattern as a modified copy of the at least one initial pattern, wherein the at least one specialized pattern comprises additional content information common to several instances of the set of instances associated with the at least one initial pattern;
dividing the set of instances associated with the at least one initial pattern into a set of instances associated with the at least one initial pattern and a set of instances associated with each at least one specialized pattern;
wherein, for each initial or specialized pattern, the method further comprises:
evaluating a first coding cost where the initial or specialized pattern is used for coding a set of instances associated with the initial or specialized pattern,
evaluating a second coding cost where the initial or specialized pattern is not used for coding the set of instances associated with the initial or specialized pattern,
comparing the evaluated first coding cost and the evaluated second coding cost, keeping the initial or specialized pattern in view of coding the at least one element when the first coding cost is lower than the second coding cost, and eliminating the initial or specialized pattern from usage in view of coding the at least one element when the first coding cost is higher than the second coding cost and coding the at least one element, the kept initial or specialized pattern associated with the at least one element, and pieces of information present in the at least one element and not present in the initial or specialized pattern being also coded, wherein during the step of dividing, the specialized pattern is a copy of the initial pattern to which is added additional content, and wherein instances comprising the additional content are associated with the specialized pattern and instances not including the additional content remain associated with the initial pattern.

* * * * *